(12) United States Patent
Govind et al.

(10) Patent No.: US 7,345,245 B2
(45) Date of Patent: Mar. 18, 2008

(54) ROBUST HIGH DENSITY SUBSTRATE DESIGN FOR THERMAL CYCLING RELIABILITY

(75) Inventors: Anand Govind, Fremont, CA (US); Zafer Kutlu, Menlo Park, CA (US); Farshad Ghahghahi, Los Gatos, CA (US)

(73) Assignee: LSI Logic Corporation, Milpitas, CA (US)

( * ) Notice: Subject to any disclaimer, the term of this patent is extended or adjusted under 35 U.S.C. 154(b) by 408 days.

(21) Appl. No.: 10/681,554

(22) Filed: Oct. 8, 2003

(65) Prior Publication Data

US 2005/0077081 A1 Apr. 14, 2005

(51) Int. Cl.
*H05K 1/16* (2006.01)
(52) U.S. Cl. .................... 174/260; 257/737; 257/773; 361/783
(58) Field of Classification Search ............ 257/737, 257/738, 773, 786; 361/777, 783; 174/260
See application file for complete search history.

(56) References Cited

U.S. PATENT DOCUMENTS

| 5,682,297 | A | * | 10/1997 | Silva ........................... 361/777 |
| 5,847,936 | A | * | 12/1998 | Forehand et al. ........... 361/794 |
| 6,172,305 | B1 | * | 1/2001 | Tanahashi .................... 174/255 |
| 6,229,099 | B1 | * | 5/2001 | Horiuchi et al. ............ 174/261 |
| 6,680,530 | B1 | * | 1/2004 | Pillai et al. .................. 257/700 |
| 2004/0212103 | A1 | * | 10/2004 | Kwong et al. ............... 257/786 |

* cited by examiner

*Primary Examiner*—Jeremy C Norris
(74) *Attorney, Agent, or Firm*—Trexler, Bushnell, Giangiorgi & Blackstone Ltd.

(57) ABSTRACT

A semiconductor package for a die with improved thermal cycling reliability. A first layer of the package provides ball pads dispersed throughout. A second layer of the package provides signal traces. A high stress area associated with the corner of the dies is defined. Preferably the high stress area is defined as two ball pitches away from the corner of the die. Signal traces are routed away from the high stress area and in particular signal traces are routed away from the ball pads associated with the high stress to eliminate the cracks in the routed traces.

12 Claims, 5 Drawing Sheets

ROBUST HIGH DENSITY SUBSTRATE DESIGN FOR THERMAL CYCLING RELIABILITY

BACKGROUND OF THE INVENTION

The present invention relates to packaging for semiconductors. Recent silicon technology advances have placed increased demand for high density signal routing on organic BGA substrates. Packages with a full area ball array are also being used to reduce the package body size and provide a high input/output (IO) signal density.

Increased signal routing density in the substrate is obtained by using fine pitch vias through the core so that routing layers below the core can be efficiently utilized. The via pitch reduction requires the use of thin core substrates which are susceptible to warpage during thermal excursions. Typically, the regions are under the die corner are regions of stress concentration. Under cycled thermal excursions, cracks can initiate from the ball pad edges and spread into the layers above the ball pad layer. Depending on the design, these cracks may pose a reliability hazard.

Problems exist with the packages which are currently in wide use. Currently, in full array packages, signals are typically routed directly over the ball pads under the die corner on the bottom routing layer. As an example, FIG. 1 shows a typical multi-layer organic BGA flip chip substrate that uses a 9-layer stackup 20 with a thin core. The 9-layer stackup 20 includes a layer L1, a layer L2, a layer L3, a layer L4, a layer L5, a layer L6, a layer L7, a layer L8, and a layer L9. Each of the layers is formed of a conductive material such as copper. Insulative material 21 is provided between each of the conductive layers. An upper protective mask 22 is provided proximate layer L1 and a lower protective layer 24 is provided proximate layer L9. Layer L1 provides a plurality of bump pads 26 (one of which is shown) on which a plurality of solder masses 28 (one of which is shown) are provided. The upper surfaces 28a of the solder masses 28 provide a die site on which the die (not shown) will be placed. A plurality of ball pads 30 (one of which is shown) are provided on Layer L9.

A portion of Layer L9 of the 9-layer stackup 20 is shown in FIG. 2. Circularly shaped ball pads 34 of layer L9 are dispersed throughout layer L9. The ball pads 34 may be dispersed in a partial or full-array format. Placement of a quadrant of the die over the solder masses 28 is represented by line 38. Placement of one of the corners of the die is represented by the point 38a.

A portion of Layer L8 of the 9-layer stackup 20 is shown in FIG. 3. Layer L8 provides the bottom routing layer. Placement of a quadrant of the die over the solder masses 28 is represented by line 38. Signal traces 36 are dispersed throughout layer L8. Numerous signal traces 36 and other metal structures extend across the layer L8 proximate the die corner 38a.

The signal traces 36 of layer L8 are routed over the ball pads 34 of layer L9. Areas of high stress are associated with the die corner 38a and in particular the ball pads which are positioned under the area surrounding the die corner 38a. The edges of the ball pads 34 which are associated with the die corner 38a act as stress concentration points and under temperature cycling conditions, cracks are initiated from the edges of the ball pads 34 and extend into the dielectric layer above layer L9. If traces 36 are routed or other metal structures are provided on layer L8 over the ball pads 34 associated with the die corner 38a, the cracks can extend through the traces 36 and cause failures due to trace cracks under cycled stress conditions.

One existing solution to overcoming this problem is to place metal planes on the layer L9 under the die corner 28. A disadvantage of placing metal planes on the layer L9, however, is that it reduces the signal density. Another existing solution to overcoming this problem is to define a circular shaped area with a one (1) millimeter radius using placement of the die corner 38a as the center of the circle. When routing traces on layer L8, traces are not routed within this circular region. A disadvantage of having a one (1) millimeter radius region under the die corner 38a is that it is not sufficient to avoid trace cracks in the layer L8 under temperature cycling conditions for all packaging technolgies.

Therefore, an improved package is needed which will reduce cracks in the signal traces and therefore avoids functional failures caused by stresses under the die corner. The present invention provides such a package. Features and advantages of the present invention will become apparent upon a reading of the attached specification, in combination with a study of the drawings.

OBJECTS AND SUMMARY OF THE INVENTION

A primary object of an embodiment of the present invention is to provide an improved package with no failures.

Another object of an embodiment of the present invention is to provide an improved package which eliminates the occurrences of cracks in the signal traces.

Briefly, and in accordance with the foregoing, an embodiment of the present invention provides an improved package in which a high stress area associated with the die corner is defined and in which the signal traces are routed away from the high stress areas at the die corner. The invention describes a methodology for signal trace routing in the high stress area under the die corder that incorporates a range of die sizes.

BRIEF DESCRIPTION OF THE DRAWINGS

The features of the present invention which are believed to be novel, are described in detail herein below. The organization and manner of the structure and operation of the invention, together with further objects and advantages thereof, may best be understood by reference to the following description taken in connection with the accompanying drawings wherein like reference numerals identify like elements in which.

DETAILED DESCRIPTION OF THE ILLUSTRATED EMBODIMENT

Figure 1:
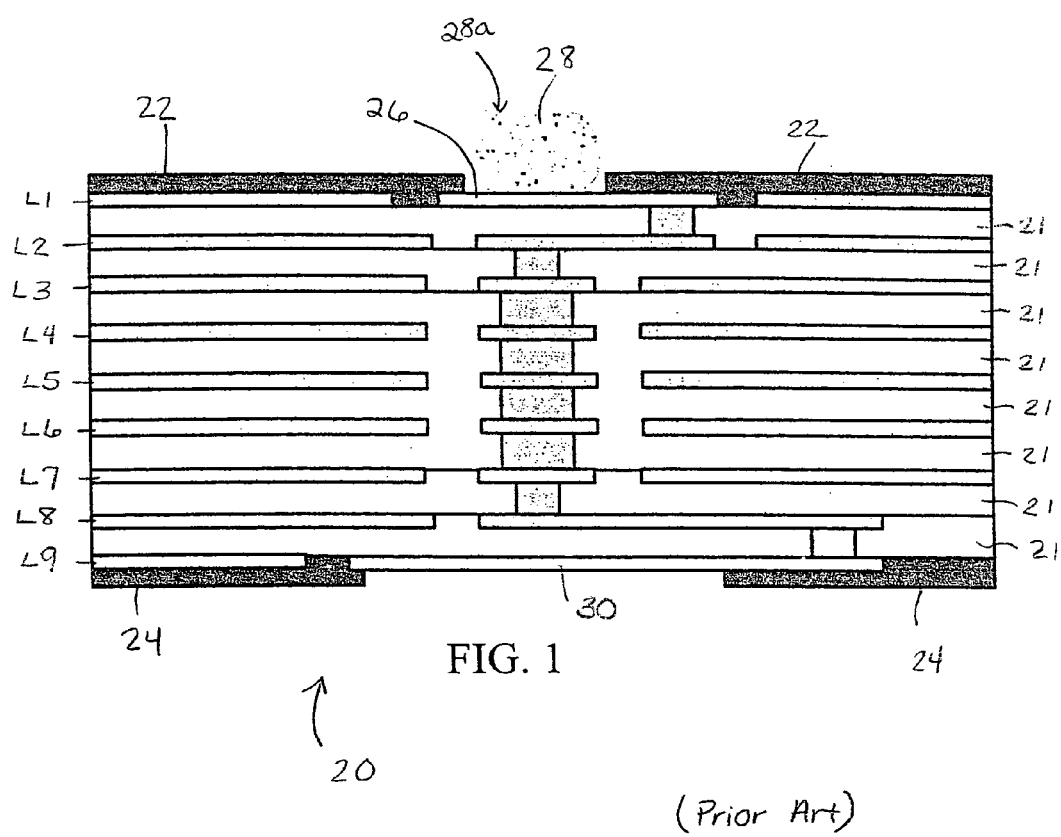
FIG. 1 is diagram illustrating a 9-layer stackup.
Figure 2:
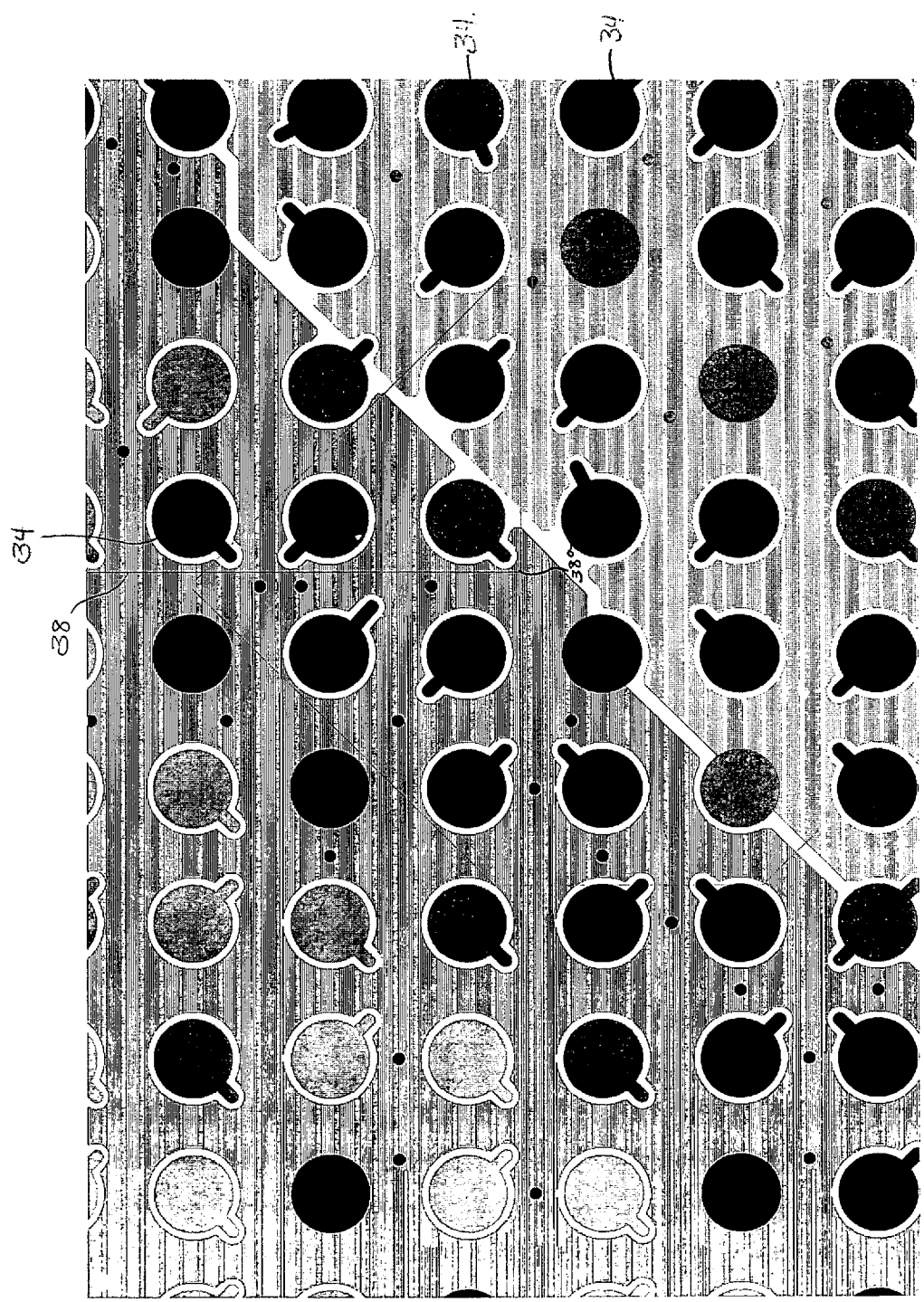
FIG. 2 is a diagram representing layer L9 of the 9-layer stackup of FIG. 1.
Figure 3:
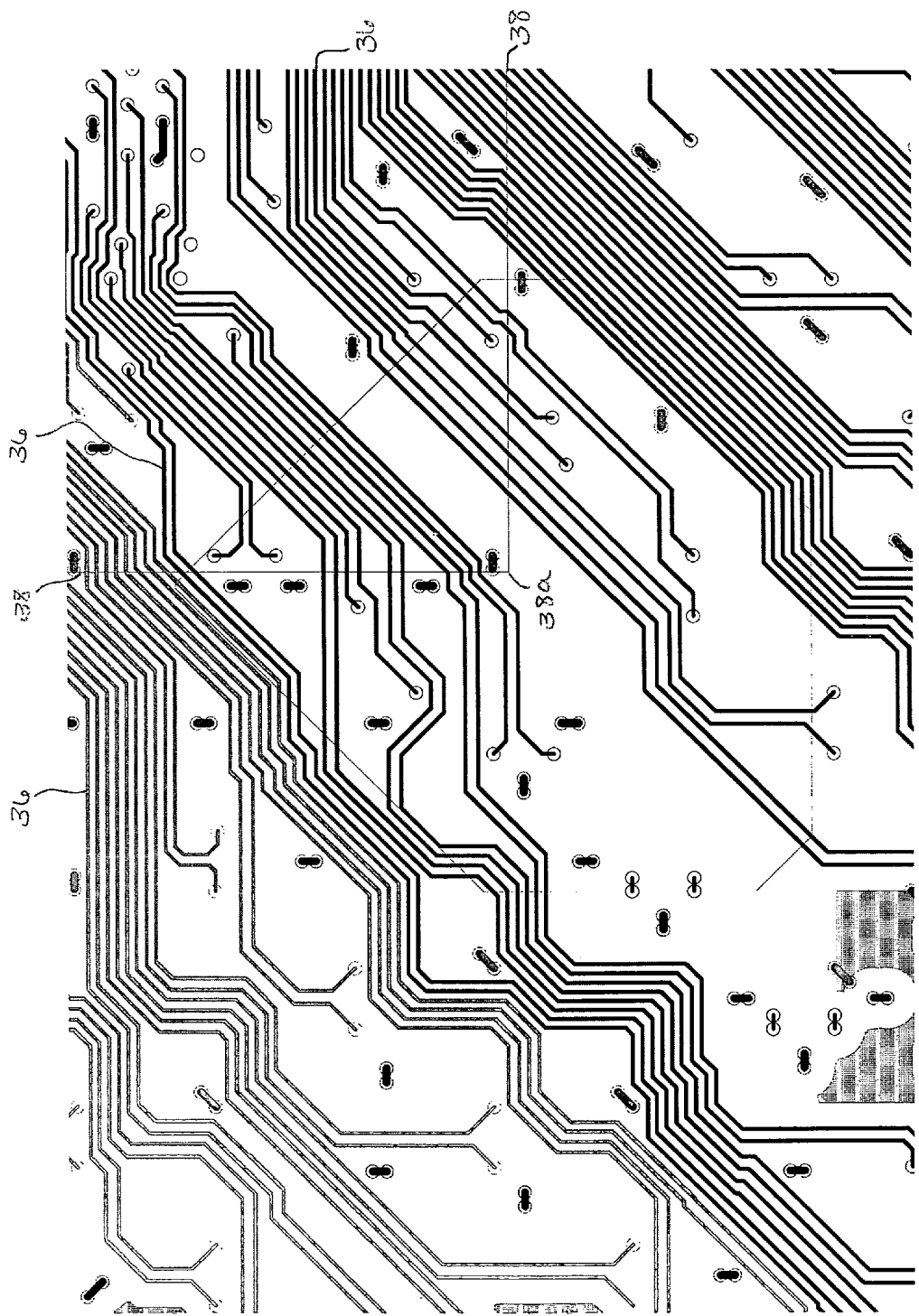
FIG. 3 is a diagram representing layer L8 of the 9-layer stackup of FIG. 1.

While this invention may be susceptible to embodiment in different forms, there is shown in the drawings and will be described herein in detail, a specific embodiment with the understanding that the present disclosure is to be considered an exemplification of the principles of the invention, and is not intended to limit the invention to that as illustrated and described herein.

An embodiment of the present invention provides a substrate package in which signal traces are routed away from the high stress area associated with the ball pads and the corner of the die.

Figure 4:
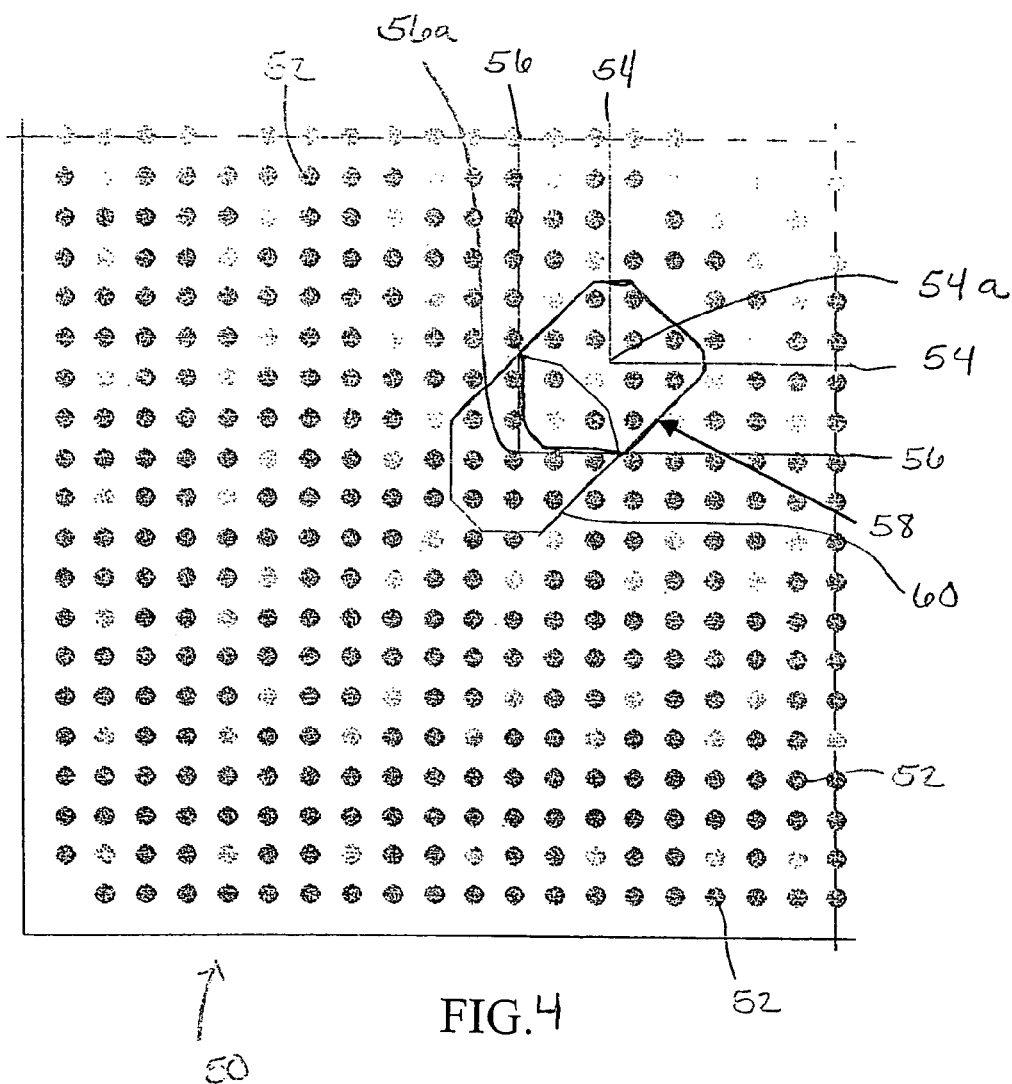
FIG. 4 is a diagram of a portion of layer L9 of a substrate package which is in accordance with an embodiment of the present invention, illustrating high stress zones.

A quadrant of the L9 layer 50 of a 9-layer stackup is shown in FIG. 4. The remaining quadrants of the layer L9 are similar to the quadrant shown. Ball pads 52 are dispersed through the L9 layer 50. It is to be understood that although the invention is described in connection with a 9-layer stackup, the invention applies to any multi-layer stack up that uses a thin core. Lines 54, 56 represent placement of die quadrants. Varying sized dies can be used. Line 54 represents placement of a die and the associated corner 54a of one size and line 56 represents placement of a die of a larger size and the associated corner 56a. A high stress zone 58 is associated with the die corner 54a and a high stress zone 60 is associated with the die corner 56a. Each high stress zone 58, 60 is similarly shaped. A portion of high stress zone 58 over laps a portion of high stress zone 60. The high stress zone 58 extends approximately two ball pitches away from the die corner 54a in each direction. The high stress zone 60 extends approximately two ball pitches away from the die corner 56a in each direction. Several ball pads 52 are provided within the high stress zone 58 and several ball pads are provided within the high stress zone 60.

Figure 5:
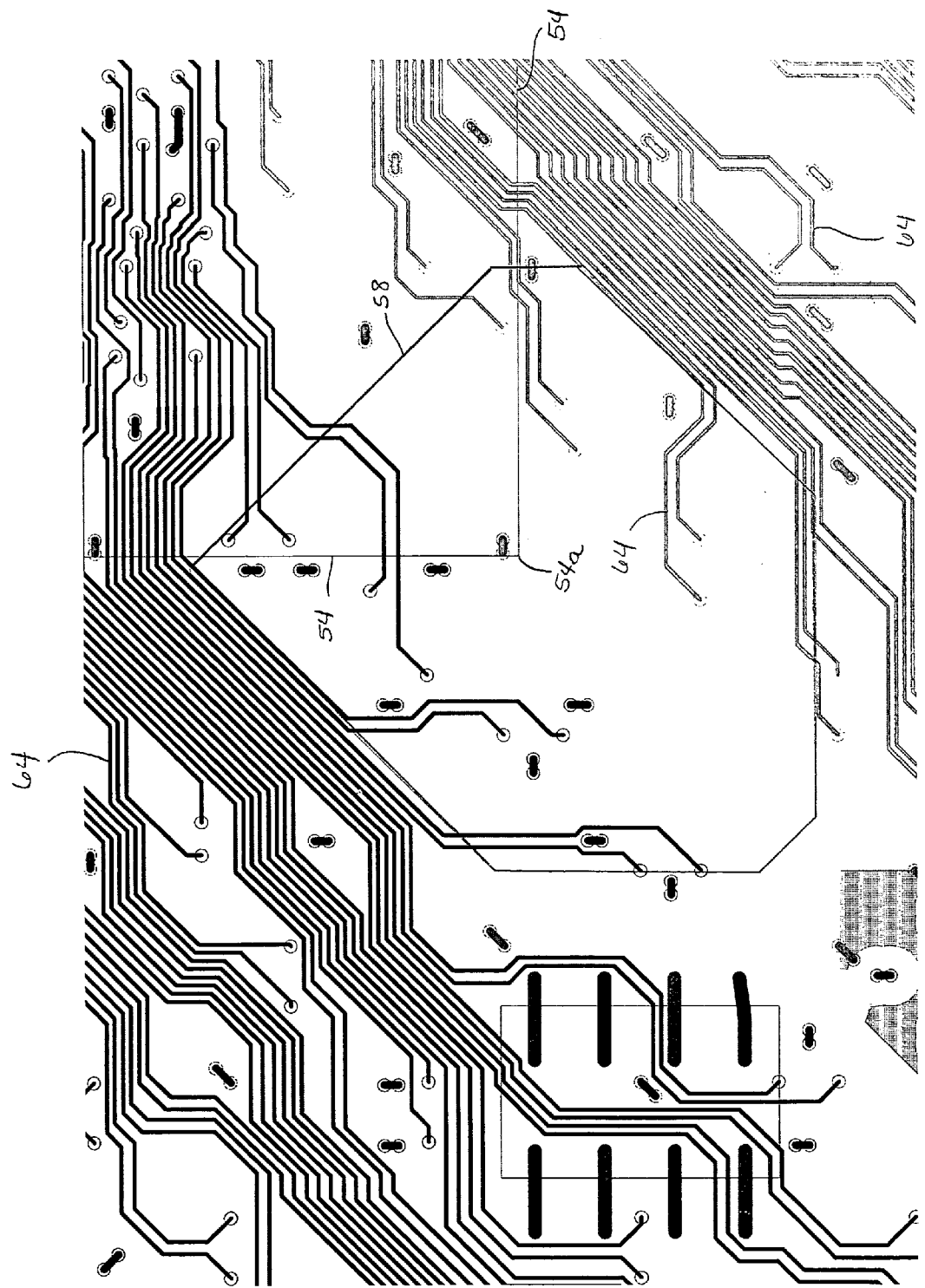
FIG. 5 is a diagram representing layer L8 of a 9-layer stackup of a substrate package which is in accordance with an embodiment of the present invention.

A portion of layer L8 is shown in FIG. 5. Layer L8 is the bottom routing layer of the 9-layer stackup. Layer L8 includes signal traces and other metal structure, such as, for example, voltage bus bars, dispersed throughout the layer.

Line 54 represents placement of a relatively small sized die relative to layer L8. Point 54a represents placement of the die corner.

The high stress area 58 defined in connection with layer L9, also is represented on layer L8. Signal traces 64 and other metal structures are provided throughout layer L8, however, within the high stress area 58, the signal traces 64 and other metal structures, for example, voltage bus bars, are routed away from the die corner 54a. Thus, the high stress area 58 on layer L8 includes a very small number of signal traces 64 and other metal structures. Preferably, all of the signal traces 64 are routed outside the high stress area 58. If, however, the traces 64 cannot be moved outside the high stress zone 58, the traces 64 are routed so as to avoid routing the traces 64 over the ball pads 52 of layer L9 within the high stress area 58. Traces on L8 may be routed over sections of continuous solid plane on L9 within the high stress region. In the event a larger size die is used, the signal traces 64 will be routed outside the high stress zone 60 defined in connection with layer L9.

Because the signal traces 64 and other metal structures are not provided over the ball pads 52, cracks initiated from the ball pad edges during thermal cycling do not affect the traces 64 and other metal structures and therefore thermal cycling reliability of the package is improved.

Although the invention has been described with respect to a nine layer stack-up, the present invention and method of routing signal traces away from the die corner can be used in connection with PTFE or thin core substrate technology in multiple layer stack ups such as, five layer or seven layer stack ups. The present invention can also be used in connection with other multi-layer build-up substrate designs with a thin core and signals routed below the die corner, such as, for example, six layer, eight layer, and ten layer, etc. The present invention can also be applied to other substrate and packaging technologies such as wirebond BGAs.

While a preferred embodiment of the present invention is shown and described, it is envisioned that those skilled in the art may devise various modifications of the present invention without departing from the spirit and scope of the appended claims.

The invention is claimed as follows:

1. A semi-conductor package comprising:
   a top layer having a die mounted thereon, said die having a corner; and
   a plurality of layers under the top layer, said plurality of layers comprising a bottom routing layer having signal traces thereon, and a ball pad layer under the bottom routing layer, said ball pad layer having a plurality of ball pads, wherein none of the signal traces of the bottom routing layer are located over ball pads of the ball pad layer which are disposed in an area within two ball pad pitches of the corner of the die.

2. A package as recited in claim 1, wherein none of the signal traces of the bottom routing layer are located within two ball pad pitches of the corner of the die.

3. A package as recited in claim 1, wherein said ball pad layer has a plurality of ball pads dispersed thereon and no metal traces on the ball pad layer which are connected to the ball pads.

4. A package as recited in claim 1, wherein the package comprises nine layers with the routing layer being the eighth layer and the ball pad layer being the ninth layer, on a bottom of the package.

5. A package as recited in claim 1, wherein the die is mounted to the top layer in an arrangement other than a pin connection.

6. A package as recited in claim 1, wherein the signal traces on the bottom routing layer comprise at least one voltage bus bar.

7. A semi-conductor package comprising:
   a top layer having a die mounted thereon, said die having a corner defining a surrounding area of increased stress; and
   a plurality of layers under the top layer, said plurality of layers comprising a bottom routing layer having signal traces thereon, and a ball pad layer under the bottom routing layer, said ball pad layer having a plurality of ball pads dispersed thereon, wherein none of the signal traces of the bottom routing layer are located within the area of increased stress defined by the corner of the die.

8. A package as recited in claim 7, wherein none of the signal traces of the bottom routing layer are located within two ball pad pitches of the corner of the die.

9. A package as recited in claim 7, wherein said ball pad layer has a plurality of ball pads dispersed thereon and no metal traces on the ball pad layer which are connected to the ball pads.

10. A package as recited in claim 7, wherein the package comprises nine layers with the routing layer being the eighth layer and the ball pad layer being the ninth layer, on a bottom of the package.

11. A package as recited in claim 7, wherein the die is mounted to the top layer in an arrangement other than a pin connection.

12. A package as recited in claim 7 wherein the signal traces on the bottom routing layer comprise at least one voltage bus bar.

* * * * *